United States Patent [19]

Ando

[11] Patent Number: 4,701,889
[45] Date of Patent: Oct. 20, 1987

[54] STATIC SEMICONDUCTOR MEMORY DEVICE

[75] Inventor: Manabu Ando, Tokyo, Japan

[73] Assignee: NEC Corporation, Tokyo, Japan

[21] Appl. No.: 737,006

[22] Filed: May 23, 1985

[30] Foreign Application Priority Data

May 31, 1984 [JP] Japan .................................. 59-111317

[51] Int. Cl.$^4$ .............................................. G11C 8/00
[52] U.S. Cl. ..................................... 365/230; 365/203
[58] Field of Search ............... 365/203, 190, 189, 230, 365/233

[56] References Cited

U.S. PATENT DOCUMENTS

| 4,272,832 | 6/1981 | Ito ........................................ 365/189 |
| 4,338,679 | 7/1982 | O'Toole .............................. 365/203 |
| 4,355,377 | 10/1982 | Sud et al. ........................... 365/203 |
| 4,360,903 | 11/1982 | Plachno et al. .................. 365/233 X |

FOREIGN PATENT DOCUMENTS 48112 12/1981 Japan .................................. 365/203

OTHER PUBLICATIONS

Japanese Utility Model Laid-open Specification No. 58-114596, May 8, 1983.

Primary Examiner—Joseph A. Popek
Attorney, Agent, or Firm—Sughrue, Mion, Zinn, Macpeak, and Seas

[57] ABSTRACT

A static semiconductor memory device includes a memory cell matrix having word and digit lines connected to memory cells, an X address decoder connected to the word lines, a gate circuit connected to the digit lines, a Y address decoder connected to a gate of the gate circuit, a sense amplifier connected to an output of the gate circuit, a latching circuit connected to an output of the sense amplifier, and an internal control circuit for supplying control signals to the above components. The internal control circuit controls so as to activate the X address decoder and the sense amplifier, precharge the latching circuit, supply a select signal representing an updated address to the selected word and digit lines, cause the latching circuit to latch a signal appearing across the digit line, and deactivate the X address decoder and the sense amplifier.

4 Claims, 12 Drawing Figures

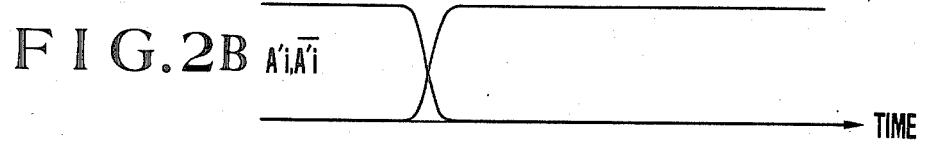
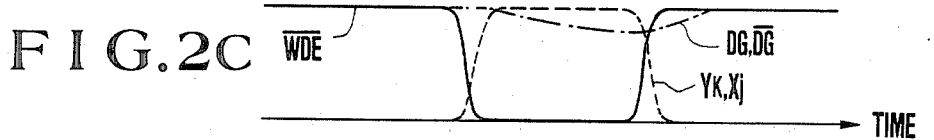
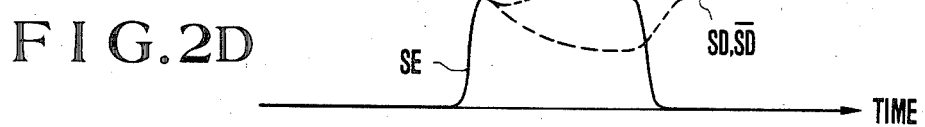
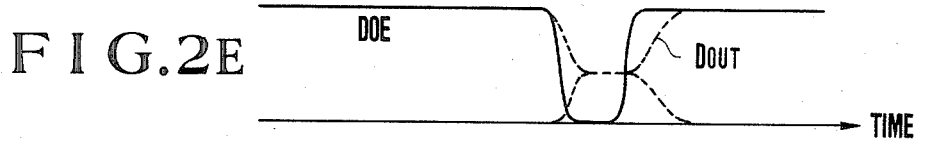

STATIC SEMICONDUCTOR MEMORY DEVICE

BACKGROUND OF THE INVENTION

The present invention relates to a semiconductor memory device and, more particularly, to an asynchronous static semiconductor memory device.

A conventional asynchronous static semiconductor memory device (to be referred to as a static memory hereinafter) has high power consumption. In order to decrease the power consumption, there has been developed a pulse word system as described in Japanese Utility Model Application No. 57-7267, wherein a word line and a sense amplifier are activated in response to an internal clock for a predetermined period of time upon address updating to latch readout data via a latching circuit, and wherein thereafter the word line and the sense amplifier are rendered inactive.

A typical circuit arrangement of the pulse word system is shown in FIG. 1. Referring to FIG. 1, reference numeral 1 denotes a memory cell matrix having M (rows)×N (columns) of memory cells MC. Each memory cell MC is connected to a corresponding word line $WL_j$ (j=0, 1, ... M) and a pair of digit lines $DG_k$ and $\overline{DG_k}$ (k=0, 1, ... N). Reference numeral 2 denotes a gate circuit connected to the digit lines $DG_k$ and $\overline{DG_k}$ and comprising switching gates $G_k$ (k=0, 1, ... N) each selecting one of the signals from the digit lines $DG_k$ and $\overline{DG_k}$. Reference numeral 3 denotes a digit line load circuit comprising load transistors $LD_k$ (k=0, 1, ... N) each of which is connected to one end of each of the digit lines $DG_k$ and $\overline{DG_k}$.

An output from each switching gate $G_k$ in the gate circuit 2 is connected to a sense amplifier 4. When the amplifier $AMP_k$ in the sense amplifier 4 receives a control signal SE, an amplified digit signal is generated therefrom. Reference numeral 5 denotes a latching circuit connected to the outputs of the sense amplifier 4. When a control signal DOE is applied to the latching circuit 5, it latches a signal supplied thereto. Reference numeral 6 denotes an output circuit each of which receives an output signal from the latching circuit 5 and generates an output $DOUT_k$. Reference numeral 7 denotes an input buffer which is connected to the digit lines $DG_k$ and $\overline{DG_k}$ to supply an input signal at an input terminal DIN to the digit lines.

Reference numeral 8 denotes an X address decoder; and 9, a Y address decoder. Outputs from the X and Y address decoders 8 and 9 are connected to the word line $WL_j$ (j=0 to M) and the gate $G_k$ of the gate circuit 2.

Reference numeral 10 denotes an internal control circuit which comprises an address buffer 11, an address transfer detector 2, and an internal control signal generator 13. The address buffer 11 receives an address input $A_i$ (where $A_i$ is the ith bit signal) and generates a pair of complementary signals $A_i'$ and $\overline{A_i'}$. The outputs from the address buffer 11 are supplied to NOR gates 8-j (j=0 to M) in the X address decoder 8 and NOR gates 9-k (k=0 to N) in the Y address decoder 9.

The address transfer detector 12 detects an address transfer on the basis of the signal from the address buffer 11 and supplies an address transfer detection signal $AE_i$ to the internal control signal generator 13.

The internal control signal generator 13 generates internal control signals $\overline{WDE}$, SE and DOE in accordance with the signal $AE_i$ supplied from the address transfer detector 12. The control signal $\overline{WDE}$ is connected to the NOR gates 8-j in the X address decoder 8 and is called a word drive signal. The control signal SE is connected to the sense amplifier 4 and is called a sense enable signal. The control signal DOE is connected to the latch circuit 5 and is called a latch signal.

The general operation of the circuit described above will now be described with reference to the timing charts of FIGS. 2A to 2E which illustrate system waveforms when an input signal of low rise (fall) time is applied to the above circuit. In FIGS. 2A to 2E, signals are plotted along the same time base. When the address input $A_i$ is updated, outputs $A_i$ and $A_i'$ from the address buffer 11 are also updated, thereby causing the address transfer detector 12 to generate the address transfer detection signal $AE_i$. In response to the signal $AE_i$, the word drive signal $\overline{WDE}$ goes low to enable the X address decoder 8. The voltage level of the selected word line $WL_j$ is set at the high level. In the gate circuit 2, the transistor $G_k$ selected by the Y address decoder 9 is turned on. A data signal from the selected memory cell MC appears on the digit lines $DG_k$ and $\overline{DG_k}$, and is supplied to the amplifier AMP in the sense amplifier 4 through the transistor $G_k$ in the gate circuit 2. When the data signal is supplied to the sense amplifier 4, the sense enable signal SE goes high, thereby enabling the amplifier AMP in the sense amplifier 4 and hence amplifying the readout data. After the sense amplifier 4 is enabled, the latching circuit 5 is reset. When sufficiently large signals SD and $\overline{SD}$ appear from the sense amplifier 4, the latch signal DOE goes high to enable the latching circuit 5. Thereafter, the signals SE and $\overline{WDE}$ go low.

During the operation sequence described above, the order of activation of the word line $WL_j$, the sense amplifier 4 and the latching circuit 5 is critically important, and must be maintained even when the rise and fall times of the input signal are long, a factor not considered in the conventional circuit. When this sequence is not properly performed, a system failure occurs. FIGS. 3 to 5 show improper sequences which may result from a failure to consider rise (fall) time variances. The voltage VIN of the address signal $A_i$ is plotted along the abscissa, and the voltage levels of the signals $\overline{WDE}$, SE and DOE are plotted along the ordinate. Referring to FIG. 3, a voltage range $V1 \leq VIN \leq V2$ for enabling the X address decoder 8, a voltage range $V3 \leq VIN \leq V4$ for precharging the latching circuit 5, and the voltage V5 representing a logic threshold value at which the output from the X address decoder 8 changes, satisfy the inequality $V3 < V1 < V5 < V2 < V4$. Every time the latching circuit 5 is enabled, irrespective of the logical transition from high level to low level or vice versa of the address input voltage VIN, the sense amplifier 4 and the X address decoder 8 are already disabled, so that the input to the latching circuit 5 is indefinite. For this reason, the latching circuit 5 may latch improper data. In the case of FIG. 4, since the inequality $V1 < V5 < V3 < V4 < V2$ is established, no error occurs when the voltage VIN goes from low to high. However, when the voltage VIN goes from high to low, the latching circuit 5 latches the data before the output from the X address decoder 8 is updated. For this reason, the data accessed by the selected address cannot be properly generated. In the case of FIG. 5, the inequality $V5 < V1 < V3 < V4 < V2$ is established. An output from the X address decoder 8 which corresponds to the lower bits of the address signal cannot be selected. As a result, read and write access cannot be performed.

As is apparent from the above operation, the sequence of the internal control signals is very important in the pulse word system. In Japanese Utility Model Application No. 57-7267, when the transient time (i.e., the rise or fall time of the input signal) is shorter than 20 nsec, the operation can be properly performed. However, no allowance is made for operations when the rise or fall time is long (e.g., 100 nsec or longer). In an asynchronous static memory, proper operation is required irrespective of the length of the rise and fall times of the input signal. Therefore, a failure in read/write access in the conventional asynchronous static memory of the pulse word system due to the length of the rise or fall time of the input signal presents a critical problem.

SUMMARY OF THE INVENTION

It is a principal object of the present invention to provide an asynchronous static memory which has low power consumption and which is stably operated irrespective of the lengths of the rise and fall times of the input signal.

In order to achieve the above object of the present invention, there is provided a static semiconductor memory device, comprising:

a memory cell matrix having word lines and digit lines connected to memory cells constituting the memory cell matrix;

an X address decoder, an output of which is connected to a corresponding one of the word lines so as to select the corresponding word line;

a gate circuit, an input of which is connected to the digit lines;

a sense amplifier connected to an output of the gate circuit;

a latching circuit connected to an output of the sense amplifier;

an output circuit connected to an output of the latching circuit;

a Y address decoder connected to a gate of the gate circuit to supply a digit select signal to the gate; and an internal control circuit for receiving an address signal and, upon a change in the address signal, supplying a control signal to the gate circuit, the sense amplifier, the latching circuit, the output circuit and the Y address decoder to first enable the X address decoder and the sense amplifier, precharge the latching circuit, supply a select signal corresponding to an updated address signal to the word line and the digit lines, cause the latching circuit to latch an output signal from the digit lines, and finally disable the X address decoder and the sense amplifier.

According to one aspect of the present invention, assuming that the X address decoder and sense amplifier are enabled by the address signal at a level between V1 and V2; the latching circuit is maintained in a precharging condition by the address signal at a level between V3 and V4; and the output level of the X address decoder is switched by the address signal at a level V5 the inequality, $V1 < V3 < V5 < V4 < V2$ is satisfied.

BRIEF DESCRIPTION OF THE DRAWINGS

FIGS. 2A to 2E are timing charts for explaining the operation of the static memory of FIG. 1;

DESCRIPTION OF THE PREFERRED EMBODIMENT

Figure 7:
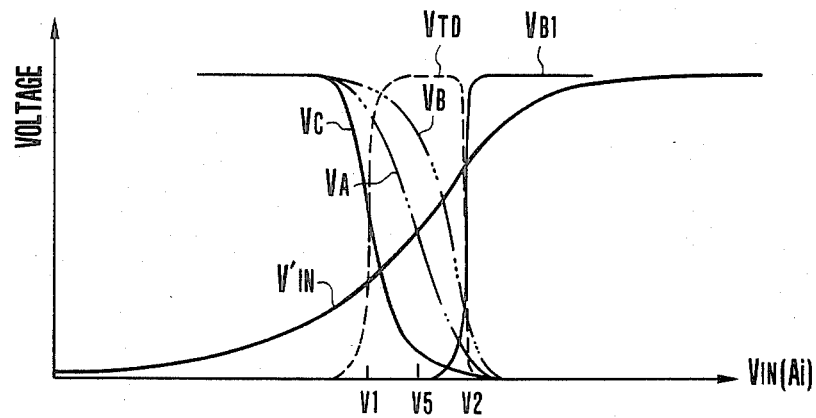
FIGS. 7 and 8 are graphs showing the DC transfer characteristics of the memory device of FIG. 6.
Figure 8:
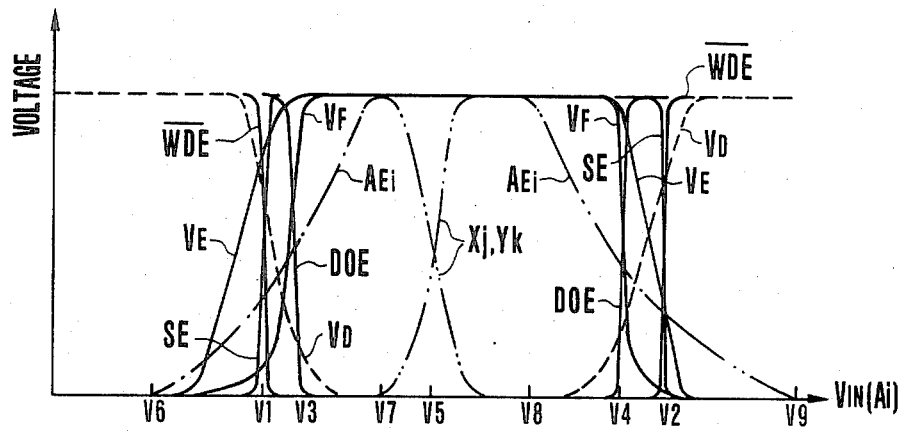

A static semiconductor memory device according to an embodiment of the present invention will be described with reference to FIGS. 6 to 8.

Figure 1:
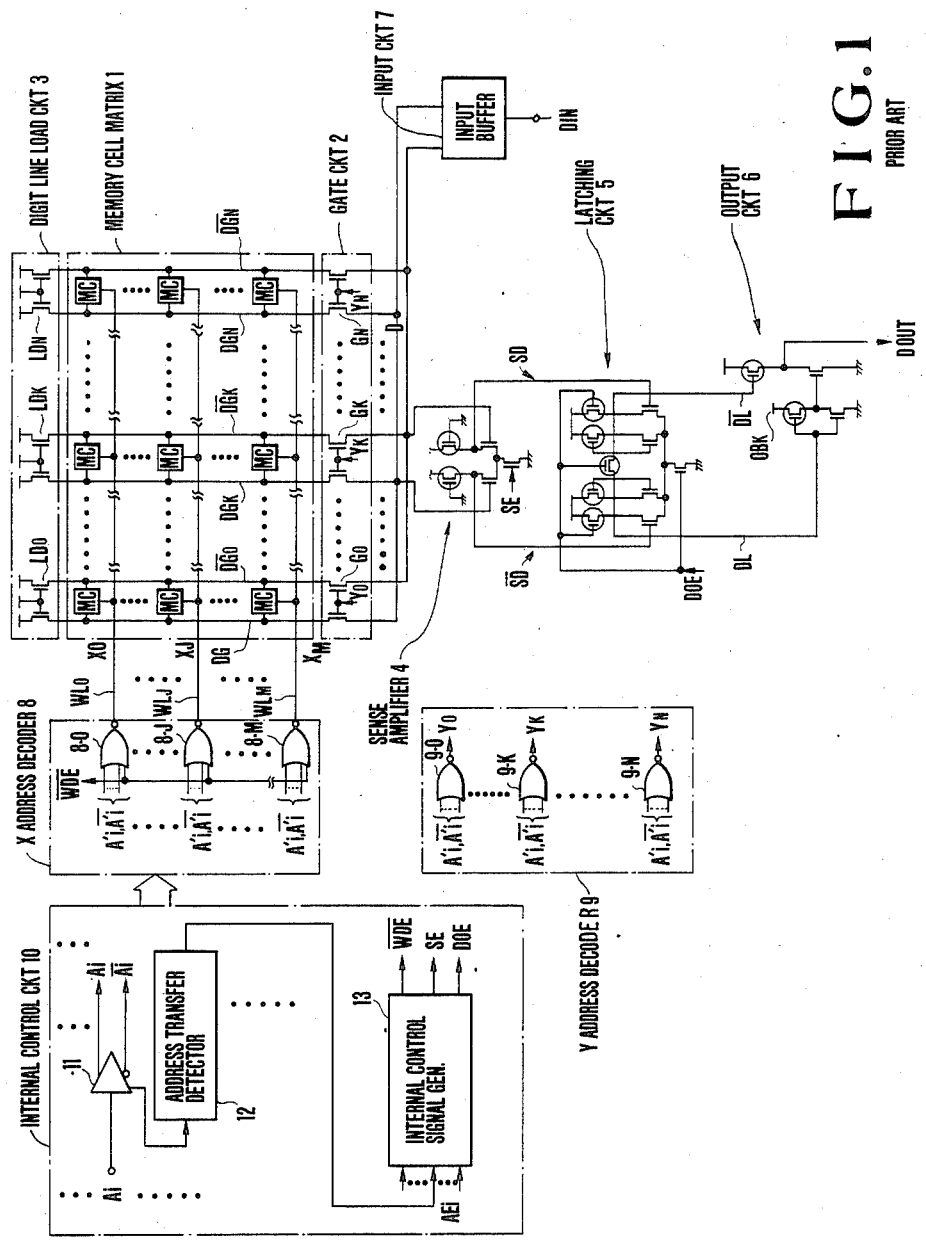
FIG. 1 is a diagram showing the system configuration using the conventional static memory of a pulse word system.
Figure 2A:
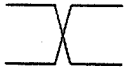
Figure 3:
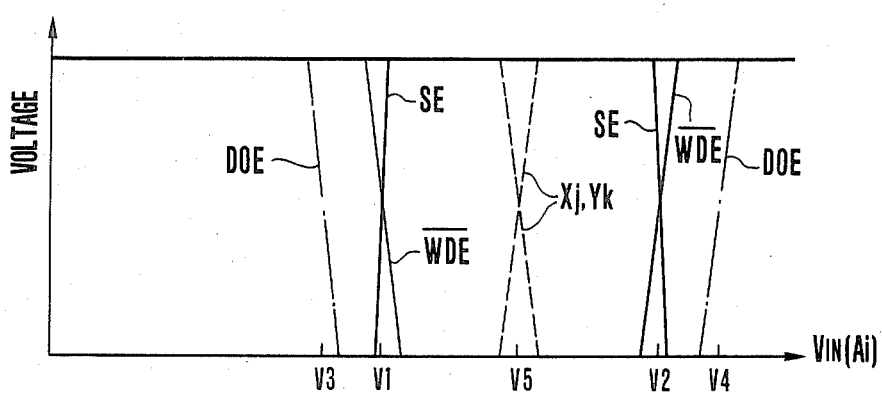
FIGS. 3 to 5 are graphs showing DC transfer characteristics; explaining the drawbacks of the conventional static memory.
Figure 4:
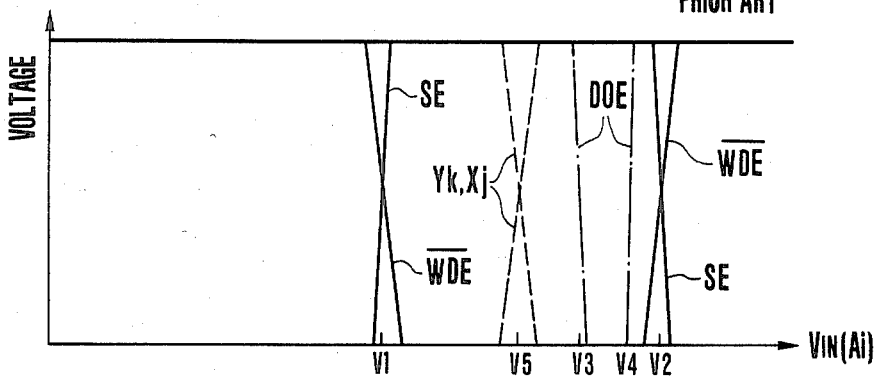
Figure 5:
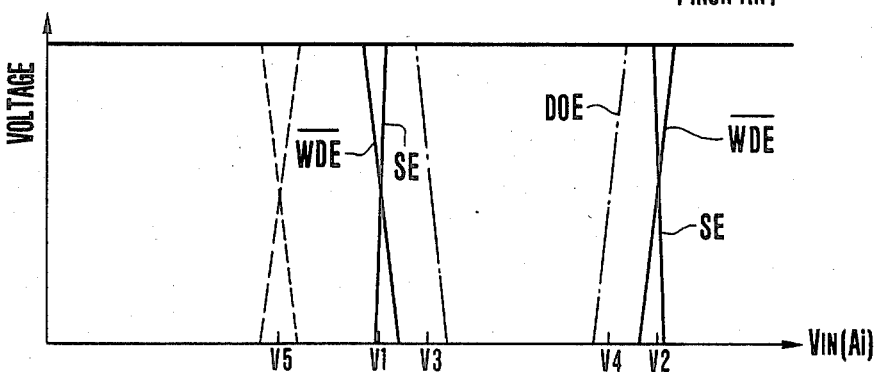
Figure 6:
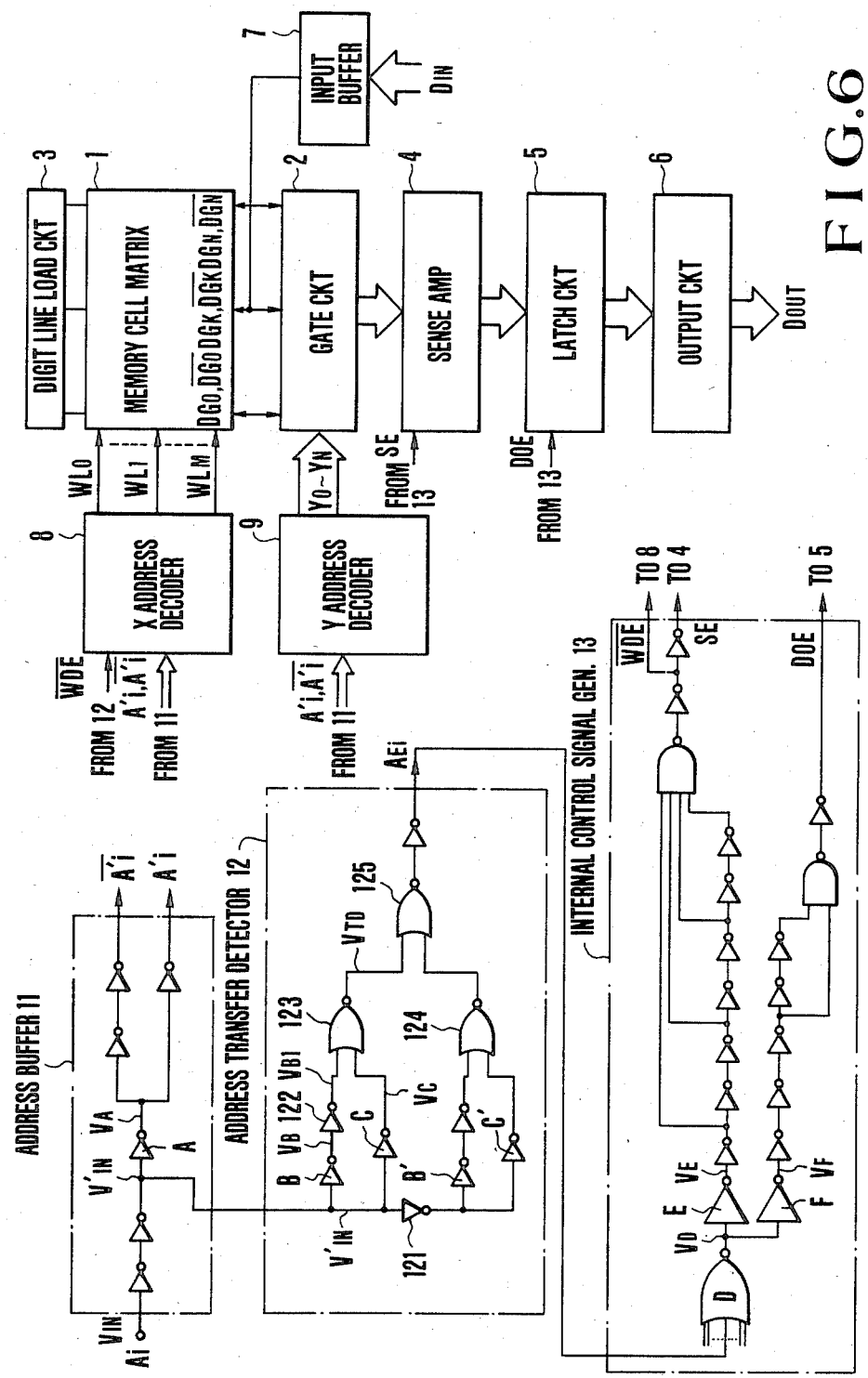
FIG. 6 is a diagram of a static semiconductor memory device according to an embodiment of the present invention.

In the static semiconductor memory shown in FIG. 6, a memory cell matrix 1, a gate circuit 2, a digit line load circuit 3, a sense amplifier 4, a latching circuit 5, an output circuit 6, a data input buffer 7, an X address decoder 8 and a Y address decoder 9 are arranged in the same manner as in FIG. 1.

The address buffer 11 and address transfer detector 12 will be described with reference to FIGS. 6 and 7. FIG. 6 shows detailed logic circuits of the address buffer 11 and the address transfer detector 12 which are illustrated in FIG. 1. Referring to FIG. 6, reference symbol Ai denotes an address signal input terminal which is connected in parallel with three inverters A, B and C through two series-connected inverters. The inverters A, B and C satisfy inequality $rB < rA < rC$ (where rA, rB and rC are the ratios of the conductances gd of the drive elements to conductances gl of the load elements, respectively). An output from the inverter A is supplied to one inverter and two series-connected inverters which generate signal Ai' and Ai'. An output from the inverter B is inverted by one inverter 122, and the inverted signal is supplied to one input terminal of a NOR gate 123. An output from the inverter C is supplied to the other input terminal of the NOR gate 123.

The input to the inverters B and C is also inverted by an inverter 121, and an inverted signal is supplied to inverters B' and C' which are respectively the same as the inverters B and C. An output from the inverter B' is inverted, and an inverted signal therefrom is supplied to one input terminal of a NOR gate 124. An output from the inverter C' is supplied to the other input terminal of the NOR gate 124. The output from the NOR gate 124 has the opposite phase to that of the NOR gate 123.

Outputs from the NOR gates 123 and 124 are supplied to a NOR gate 125. When one of the inputs is set at a high level, the NOR gate 125 generates a signal of low level. The output from the NOR gate 125 is inverted by an inverter which then generates the address transfer detection signal AEi.

The DC operations of the address buffer 11 and the address transfer detector 12 shown in FIG. 6 will be described with reference to FIG. 7. The reference characters VA, VB, etc. respresent the voltage level at the corresponding point in FIG. 6. When the input level VIN at the input terminal Ai changes from low level to high level, the input signal VIN' to the inverters A, B and C goes from low level to high level. Accordingly, the output levels VA, VB and VC of the inverters A, B and C are decreased. As described above, since the ratios of the conductances of the drive elements to those of the load elements satisfy the inequality $rB < rA < rC$, the voltage VC is decreased at VIN=V1. Subsequently, the voltage VA is decreased at VIN=V5, and finally the voltage VB is decreased at VIN=V2. When the input voltage satisfies the range V1<VIN<V2, the output VTD of the NOR gate 123 and the signal AEi of the address transfer detector 12 go high. The complementary signals Ai' and Ai' from the address buffer 11 are derived from the output from the inverter A. Since the input voltage VIN causing a change in output from the inverter A falls within the range between the voltages V1 and V2, the complementary signals Ai' and Ai' change at the voltage V5 between the voltages V1 and V2. When the input voltage VIN exceeds the voltage V2, the output VB from the inverter B is decreased, and the input level VB1 of the NOR gate 123 is set at the high level. As a result, the voltage VTD and the signal AEi go low again.

In the address buffer 11 and the address transfer detector 12 shown in FIG. 6, the address transfer detection signal AEi is set at the high level when the input voltage VIN falls within the range V1≦VIN≦V2. The address buffer output complementary signals Ai' and Ai' change at the voltage V5 satisfying inequality V1<V5<V2.

The internal control signal generator 13 for deriving the internal control signals $\overline{WDE}$, SE and DOE from the address transfer detection signal AEi, and its operation will be described with reference to FIG. 6.

In the logic circuit diagram showing the arrangement of the internal control signal generator 13, all address transfer detection signals AEi corresponding to the address signals Ai are supplied to a NOR gate D. When any one of the inputs AEi is set at high level, the NOR gate D generates a signal of low level. The output from the NOR gate D is supplied to inverters E and F. Ratios rE and rF of the conductances of the drive elements to those of the load elements satisfy the condition rE<rF.

The operation of the internal control signal generator 13 will be described with reference to FIG. 8. The voltage VIN at the address input terminal Ai is plotted along the abscissa, and the outputs from the respective inverters are plotted along the ordinate. A case will be descried wherein the address input terminal voltage VIN goes from low level to high level. When the input voltage VIN is equal to or less than the voltage V6, the address transfer detection signal AEi is set at the low level. The output voltage VD at the NOR gate D is set at the high level. The word drive signal $\overline{WDE}$ and the latching signal DOE are set at the high level, and the sense enable signal SE is set at the low level. For this reason, the X address decoder 8 and the sense amplifier 4 are rendered inactive, and the latching circuit 5 is rendered active. When the input voltage VIN exceeds the voltage V6, the level of the address transfer detection signal AEi is increased. Along with this, the output VD from the NOR gate D is decreased, thereby increasing the outputs VE and VF from the inverters E and F. As described above, however, since the ratios in the inverters E and F satisfy the condition rE<rF, the output level VE of the inverter E is first increased and then the level VF of the inverter F is increased as the output level VD of the NOR gate is decreased. When the input signal VIN goes high, the signals $\overline{WDE}$ and SE derived from the output VE of the inverter E change at VIN=V1, thereby activating the X address decoder 8 and the sense amplifier 4. Thereafter, the latch signal DOE derived from the output VF of the inverter F changes at VIN=V3, thereby precharging the latching circuit 5. The X address decoder 8 is enabled at VIN=V1 to set the corresponding word line at high level. In this case, the ratios in the inverters A, B and C of FIG. 6 are set so as not to change the levels of the output signals Ai' and Ai' generated from the address buffer 11. Therefore, it should be noted that the word line selected at the low level of VIN is set at high level.

When the voltage VIN is further increased and reaches the voltage V5, the levels of the outputs Ai' and Ai' from the address buffer 11 change to select another word line. In this case, the sense amplifier 4 is rendered active, so that the updated address data upon changing of the word line WLj is amplified by the sense amplifier 4. An amplified signal appears at the output terminal of the sense amplifier 4. When the input voltage VIN exceeds the voltage V8, the level of the address transfer detection signal AEi is decreased again. Accordingly, the output level of the NOR gate D is increased, and the output levels VE and VF of the inverters E and F are decreased. As described above, the conductance ratios in the inverters E and F satisfy condition rE<rF, the output level VF of the inverter F goes low at VIN=V4 and thereafter the output level VE is set at the low level at VIN=V2 in an opposite manner as in the case wherein the address transfer detection signal AEi goes high. After the signal DOE is set at the high level at VIN=V4 and the selected address data is latched by the latching circuit 5, the X address decoder 8 and the sense amplifier 4 are disabled at VIN=V2.

In this manner, proper operations are preformed when input level changes from low level to high level. When the input level changes from high level to low level, it will be readily understood that proper operation can be performed in a manner completely analogous to that shown in FIG. 8, and therefore a detailed description thereof will be omitted.

In the above embodiment, the conductance ratios satisfy rB<rA<rC and rE<rF. The inverters A, B, C, E and F comprise CMOS inverters each comprising a complementary transistor pair. The sizes of these transistors are given as follows:

| Inverter | Drive Tr N-ch Tr size (μ) | Load Tr P-ch Tr size (μ) | Logical Threshold |
|---|---|---|---|
| A | 10/1.9 | 20/2.2 | 2.7 V |
| B | 10/1.9 | 10/2.2 | 2.15 V |
| C | 30/1.9 | 10/2.2 | 1.65 V |
| D | 40/1.9 | 10/2.2 | 1.55 V |
| E | 20/1.9 | 10/2.2 | 1.8 V |
| F | 10/1.9 | 20/2.2 | 2.7 V |

According to the present invention as described above, a static memory with low power consumption is obtained wherein operation errors do not occur even if the rise and fall times of the input signal are long, thereby providing a great industrial advantage.

What is claimed is:

1. A static semiconductor memory device, comprising:
   a memory cell matrix comprised of memory cells arranged in rows and columns;
   a row address decoder for selecting one of said rows;
   a set of address input terminals for receiving address signals;
   a sense amplifier for operatively amplifying data from one of said columns;
   a latching circuit for operatively holding data amplified by said sense amplifier;
   an internal control circuit for generating first to third control signals when at least one of said address singals is changed in level, said internal control circuit generating said first and second control signals when a level of said changed address signal is in the range of $V_1$ to $V_2$, and generating said third control signal when a level of said changed address signal is in the range of $V_3$ to $V_4$, respectively;

means for applying said first control signal to said row address decoder, said row address decoder being enabled by said first control signal and determining the selection of a row based on said changed address signal when a level of said changed address signal is at $V_5$;

means for applying said second control signal to said sense amplifier to thereby enable said sense amplifier; and means for applying said third control signal to said latching circuit to thereby leave said latching circuit in a precharging state;

wherein the condition $V_1 < V_3 < V_5 < V_4 < V_2$ is satisfied.

2. A device according to claim 1, wherein said internal control circuit comprises: an address buffer for receiving the address signal, an address transition detecting circuit for generating an address transfer detection signal when said at least one address signal is changed in level; and an internal control signal generator for receiving the address transfer detection signal, and for generating said first to third control signals.

3. A device according to claim 2, wherein said address buffer comprises an inverter A connected to the address signal input, and wherein said address transition detecting circuit comprises inverters B and C connected in parallel with said inverter A, said three inverters A, B and C having drive element to load element conductance ratios rA, rB and rC set to satisfy the inequality rB < rA < rC, said inverter A generating a buffered address signal to be applied to said row address decoder, and outputs from said inverters B and C being used to generate said address transfer detection signal.

4. A static semiconductor memory device comprising;

a memory cell matrix comprises of a plurality of memory cells arranged in rows and columns;

a plurality of address input means for receiving address signals;

a plurality of address buffers for generating true and complementary address signals from said address signals, each of said address buffers including a first inverter receiving one of said address signals;

a plurality of address transfer detector circuits each generating an address transfer detection signal when one of said address signals is changed in level, and address transfer detection circuits each including a second inverter for receiving one of said address signals, a third inverter for receiving said one of said address signals and first logic circuit means responsive to outputs of said second and third inverters for generating said address transfer detection signal;

said first to third inverters having drive element to load element conductance ratios rA, rB and rC such that rB < rA < rC, a row address decoder for selecting one of said rows;

a sense amplifier for operatively amplifying data from one of columns;

a latching circuit for operatively holding data amplified by said sense amplifier; and an internal control circuit for generating a first control signal for enabling said row address decoder, a second control signal for enabling said sense amplifier and a third control signal for leaving said latching circuit in a prechanging state, said internal control circuit including gate means receiving outputs of said address transfer detection circuit, a fourth inverter E receiving an output of said gate means, a fifth inverter F receiving said output of said gate means, first delay means responsive to an output of said fourth inverter for generating said first and second control signals and second delay means responsive to an output of said fifth inverter for generating said third control signal, said fourth and fifth inverters having drive element to load element conductance ratios rE and rF such that rE < rF.

* * * * *

UNITED STATES PATENT AND TRADEMARK OFFICE
CERTIFICATE OF CORRECTION

PATENT NO. : 4,701,889

DATED : October 20, 1987

INVENTOR(S) : Manabu Ando

It is certified that error appears in the above-identified patent and that said Letters Patent is hereby corrected as shown below:

Column 6, line 8, delete "Ai'" insert ----$\overline{Ai'}$--.

Column 1, line 41, delete "each of";

Column 1, line 53, delete "2", insert --12--;

Column 1, line 56, delete second occurrence of "Ai'", insert --$\overline{Ai'}$--.

Column 2, line 11, after "outputs" delete "Ai", insert --$\overline{Ai'}$--, after "Ai and" delete "Ai'" insert --$\overline{Ai'}$--.

Column 4, line 34, delete second occurrence of "Ai'" insert --$\overline{Ai'}$--.

Column 5, line 4, delete second occurrence of "Ai'" insert --$\overline{Ai'}$--;

Column 5, line 8, delete second occurrence of "Ai'" insert --$\overline{Ai'}$--;

Column 5, line 20, delete "Ai'" insert ----$\overline{Ai'}$--.

Column 6, line 2, delete second occurrence of "Ai'" insert --$\overline{Ai'}$--;

Signed and Sealed this

Ninth Day of August, 1988

*Attest:*

DONALD J. QUIGG

*Attesting Officer*      *Commissioner of Patents and Trademarks*